United States Patent [19]

Takemura et al.

[11] Patent Number: 4,721,999
[45] Date of Patent: Jan. 26, 1988

[54] COLOR IMAGING DEVICE HAVING WHITE, CYAN AND YELLOW CONVEX LENS FILTER PORTIONS

[75] Inventors: Yasuo Takemura, Tokyo; Masataka Miyamura, Kamakura; Yoshinori Takizawa, Tokyo, all of Japan

[73] Assignee: Kabushiki Kaisha Toshiba, Kawasaki, Japan

[21] Appl. No.: 602,689

[22] Filed: Apr. 23, 1984

[30] Foreign Application Priority Data

Apr. 26, 1983 [JP] Japan .................................. 58-72104

[51] Int. Cl.4 .................... H04N 9/077; H04N 5/335; H04N 9/04; G03F 7/26
[52] U.S. Cl. ......................................... 358/44; 358/41; 358/209; 358/211; 358/213.13; 430/7; 430/321
[58] Field of Search ................. 358/41, 43, 44, 48, 358/209, 211, 212, 213; 430/7, 321

[56] References Cited

U.S. PATENT DOCUMENTS

| | | | |
|---|---|---|---|
| 1,722,368 | 7/1929 | Comstock | 430/321 |
| 4,460,919 | 7/1984 | Takemura | 358/44 |

FOREIGN PATENT DOCUMENTS

| | | | |
|---|---|---|---|
| 135224 | 11/1978 | Japan | 358/44 |
| 124366 | 9/1980 | Japan | 358/213 |
| 46183 | 10/1981 | Japan | . |
| 56978 | 4/1982 | Japan | 358/43 |
| 134964 | 8/1982 | Japan | . |
| 13089 | 1/1983 | Japan | 358/43 |
| 114684 | 7/1983 | Japan | 358/44 |
| 125973 | 7/1983 | Japan | 358/213 |
| 219888 | 12/1983 | Japan | 358/44 |
| 32281 | 2/1984 | Japan | 358/43 |

OTHER PUBLICATIONS

Dillon, P. L. P., et al., "Fabrication and Performance of Color Filter Arrays for Solid-State Imagers", IEEE Transactions on Electron Devices, vol. ED-25, No. 2, Feb. 1978, pp. 97-101.

Dillon, P. L. P., et al., "Color Imaging System Using a Single CCD Area Array", IEEE Transactions on Electron Devices, vol. ED-25, No. 2, Feb. 1978, pp. 102-107.

Primary Examiner—James J. Groody
Assistant Examiner—Randall S. Svihla
Attorney, Agent, or Firm—Cushman, Darby & Cushman

[57] ABSTRACT

A color imaging device includes a solid state image sensor formed with a plurality of picture elements in a two dimensional array. A color filter array has filter portions in one-to-one correspondence with the picture elements. The filter portions are formed as lenses to provide a focusing effect. These lenses can include cyan focusing color filter portions, yellow focusing color filter portions, and full-color light-transmitting focusing color filter portions. All of these filter portions focus incident light using a lens effect onto respective elements on the solid state image sensor. In one embodiment, protective layers are located between filter parts. Other embodiments use tannic acid in their formation. In this way, inaccuracies in color signal separation are minimized.

7 Claims, 24 Drawing Figures

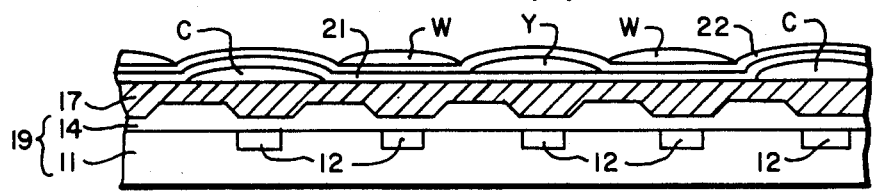
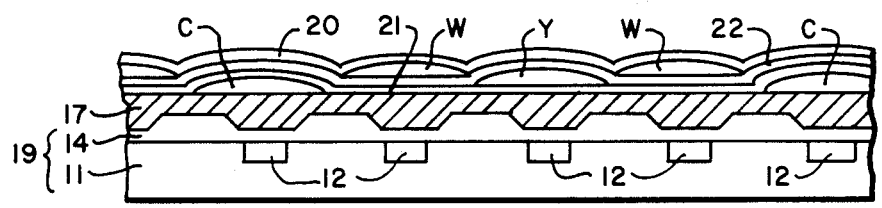

FIG. 9
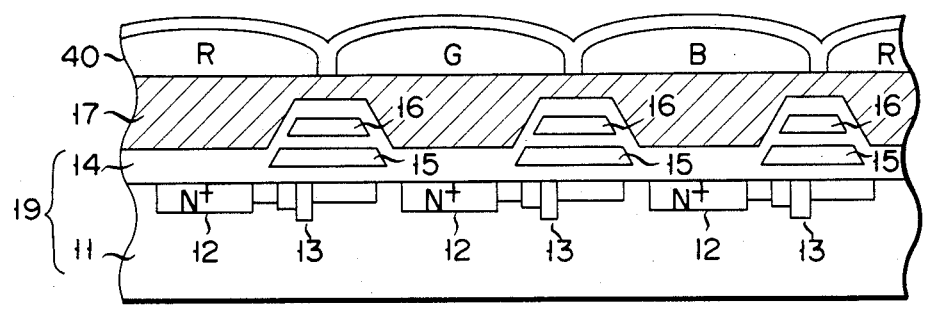
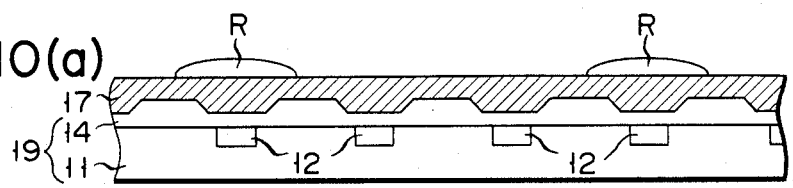
FIG. 10(a)
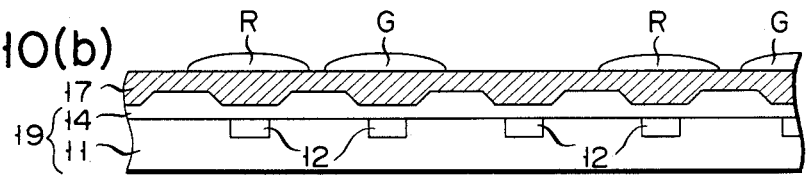
FIG. 10(b)
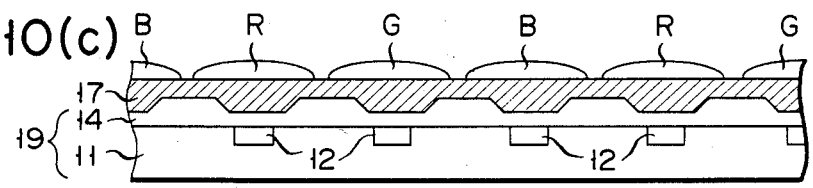
FIG. 10(c)
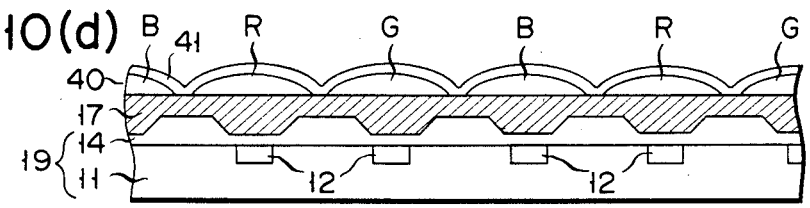
FIG. 10(d)

COLOR IMAGING DEVICE HAVING WHITE, CYAN AND YELLOW CONVEX LENS FILTER PORTIONS

BACKGROUND OF THE INVENTION

The present invention relates to a color filter for a color imaging device and a method for making the same and, more particularly, to an improvement in a color filter array structure integrally formed on a surface of a solid-state image sensor so as to improve the utilization efficiency of incident light.

A single chip color camera is receiving a great deal of attention wherein a color filter array is formed on a surface of a solid-state image sensor. The color filter array is directly formed on the surface of the solid-state image sensor in the following manner. An emulsion is applied to the surface of the solid-state image sensor, and part of the emulsion is selectively treated with a dye. The dyed portion serves as a color filter portion which absorbs light of a specific wavelength. The above process is repeated several times to prepare a checkerboard like array of color filter portions.

A solid-state image sensor used in conjunction with the filter array comprises a photodiode array as a photosensitive section, and a transfer section for transferring a signal photoelectrically transduced by a photodiode of the array. The total area of the photosensitive section comprising the photodiode array is 25 to 30% of the total surface area of the solid-state image sensor. Therefore, only a small amount of the light incident on the surface of the solid-state image sensor through a image pickup lens is subjected to the photoelectric transducing operation. 70 to 75% of the total amount of incident light does not contribute to the photoelectric transducing operation and is wasted.

SUMMARY OF THE INVENTION

The present invention has been made in consideration of the above situation and has as its object to provide a solid-state color imaging device and a process for fabricating the same, wherein a color filter portion is given a focusing function by means of its shape, so that incident light can be effectively used.

In order to achieve the above object of the present invention, a color filter portion having a convex lens shape is formed on a corresponding photosensitive element so as to impart a focusing function to the color filter portion, thereby preparing a solid-state imaging device capable of providing high spectral response or sensitivity, performing correct color signal separation, and providing good image quality.

BRIEF DESCRIPTION OF THE DRAWINGS

FIGS. 2(a)-2(j) show steps in fabricating the solid-state color imaging device shown in FIG. 1 in cross-sectional views taken along the section line shown in FIG. 4;

FIG. 9 is a sectional view of a solid-state color imaging device using the color filter array shown in FIG. 8; and FIGS. 10(a)-10(d) show steps in fabricating the solid-state color imaging device shown in FIG. 9.

DESCRIPTION OF THE PREFERRED EMBODIMENTS

Figure 1:
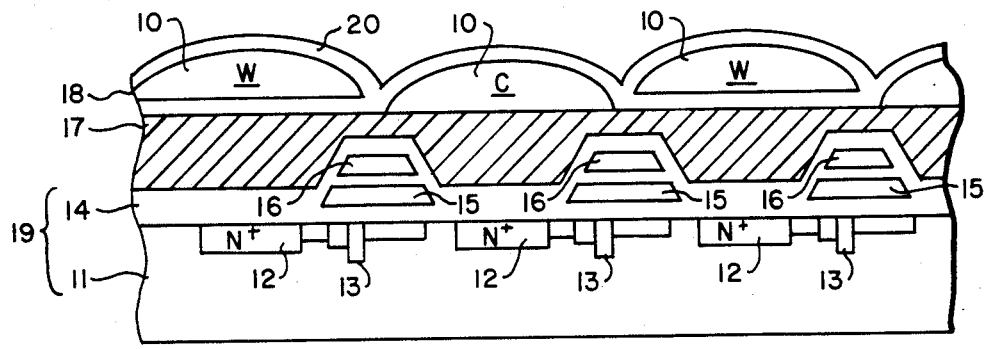
FIG. 1 is a sectional view of a solid-state color imaging device according to an embodiment of the present invention.

FIG. 1 is a sectional view of a solid-state color imaging device according to an embodiment of the present invention. A number of picture elements (i.e., photodiodes) 12 are formed on a semiconductor substrate 11 in a two-dimensional array. Transfer sections 13 are formed between every two adjacent photodiodes 12.

First and second polysilicon wiring layers 15 and 16 are formed through an insulating film 14, such as an $SiO_2$ film, on portions of the semiconductor substrate 11 which correspond to the transfer sections 13, thereby constituting a solid-state image sensor 19. In this solid-state image sensor 19, when a drive signal is supplied to the wiring layers 15 and 16, a signal that is photoelectrically transduced by a given picture element 12 is transferred through a corresponding transfer section 13.

Figure 4:
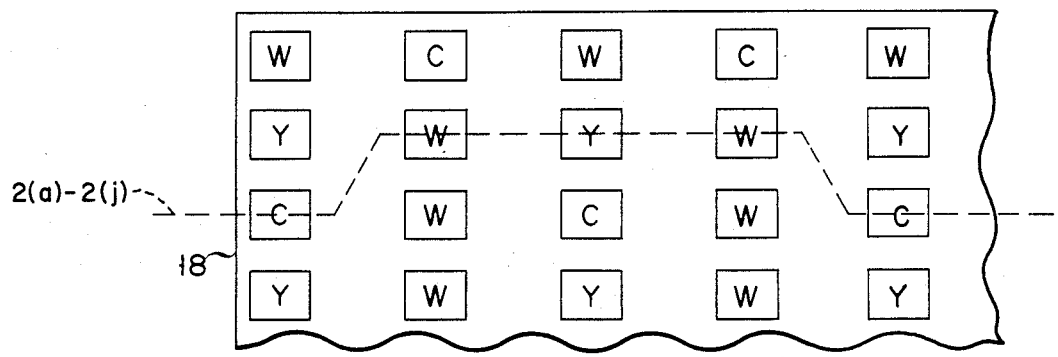
FIG. 4 is a schematic representation of a color filter array shown in FIG. 1.

Since steps are formed on the surface of the solid-state image sensor 19 because of the presence of the wiring layers 15 and 16, a base layer 17 is formed thereover to provide an even surface to the solid-state image sensor 19. A color filter array 18 consisting of full-color light-transmitting filter portions W (white), red-light cutoff filter portions C (cyan), and blue-light cutoff filter portions Y (yellow) is formed on the upper surface (even surface) of the base layer 17. FIG. 1 is a sectional view of a region where only filter portions W and C are arranged; thus, filter portions Y are not illustrated therein. These filter portions constitute focusing portions 10 as the main feature of the present invention. The respective filter portions W, C, and Y are aligned with the respective photodiodes 12 in one-to-one correspondence. The sequence of colors is illustrated in FIG. 4.

A filter-protective overcoat layer 20 is formed on the surface of the color filter array 18. In the solid-state color imaging device of the present invention, each of the color filter portions formed as the focusing portions 10 constitutes a convex lens so as to improve the utilization efficiency of incident light.

Figure 2A:
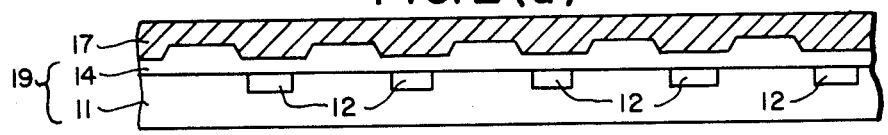
Figure 2B:
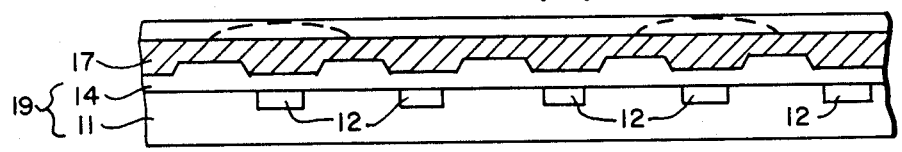

The filter portions C, W, and Y can be prepared by various processes. However, a process for preparing these filter portions will be described with reference to FIGS. 2(a)-2(j) which are cross-sectional views taken along the section line shown in FIG. 4. The base layer 17 is formed on the surface of the solid-state image sensor 19 as follows. The base layer 17 is prepared to have an even surface as shown in FIG. 2(a) by applying a transparent acrylic-based negative resist (having a viscosity of 100 cp) using a spinner (1,500 rpm) to the surface of the image sensor 19. This is exposed and developed by a ketone-based solvent, and a nonexposed portion is removed. A dye receiving layer is then formed on the even surface of the base layer 17 as shown in FIG. 2(b). A transparent resist, obtained by adding 10% by weight of ammonium dichromate in casein, is used to form the dye receiving layer. A mask having openings corresponding to certain predetermined photodiodes 12 is used to form a dye receiving layer pattern. An ultraviolet ray irradiates the transparent resist through the openings of a mask. In order to dye portions of the dye receiving layer, the solid-state image sensor having the dye receiving layer pattern is dipped in a dye solution (cyan or yellow; pH 5, 60° C.).

Figure 2C:
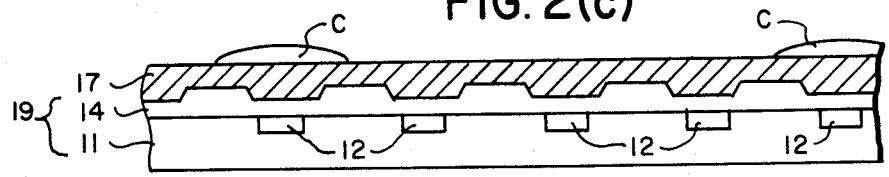
Figure 2D:
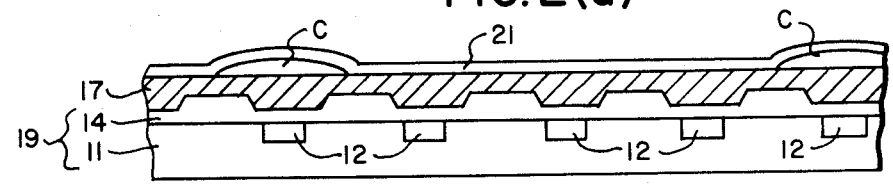
Figure 2E:
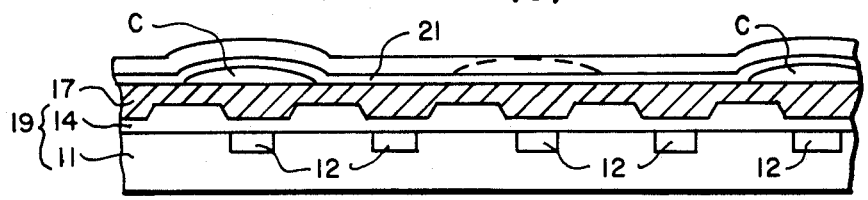
Figure 2F:
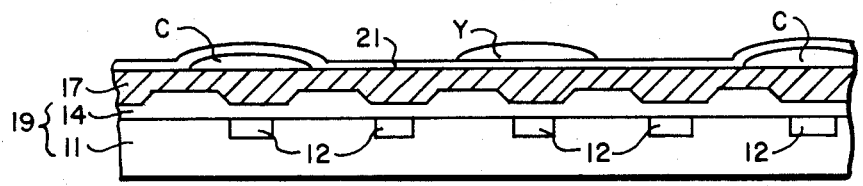
Figure 2G:
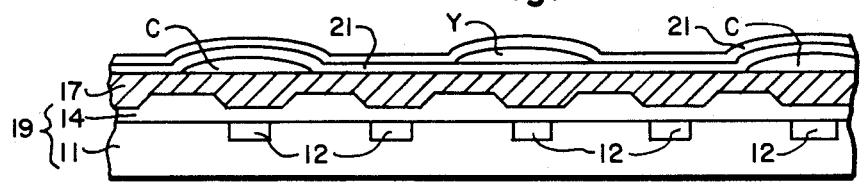
Figure 2H:
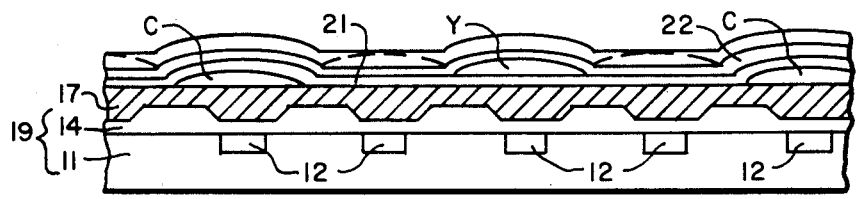

FIG. 2(c) shows the state wherein the resultant structure having a first dye receiving portion layer is dipped in a cyan dye solution, thereby forming the filter portions C. In order to prevent the yellow color from blurring from the filter portions, an intermediate layer 21 is then formed to cover the entire surface, as shown in FIG. 2(d). The intermediate layer 21 comprises the same transparent acrylic-based resist as used in the base layer 17, and is exposed with an ultraviolet ray. Filter portions Y are formed on the intermediate layer 21 at portions corresponding to other predetermined photodiodes 12 as shown in FIGS. 2(e) and 2(f) in the same manner as in the formation of the filter portions C. In this case, a yellow dye solution is used. In order to prevent the yellow color from blurring from the filter portions Y, another intermediate layer 22 is formed over the resultant structure in the same manner as the intermediate layer 21 as shown in FIG. 2(g). Subsequently, filter portions W of a convex lens shape are formed on portions of the second intermediate layer which correspond to still other predetermined photodiodes as shown in FIGS. 2(h) and 2(i) in the same manner as in the formation of the filter portions C and Y except that the filter portions W are not dyed. Finally, the overcoat layer 20 is formed to protect the layer of filter portions, as shown in FIG. 2(j).

Figure 3:
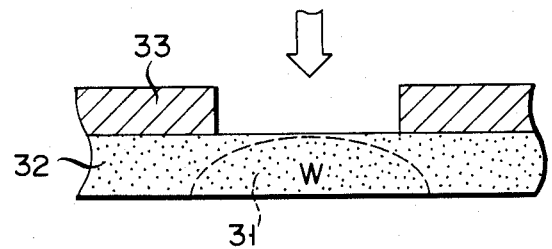
FIG. 3 is a schematic view showing the process for preparing a filter portion having a convex lens shape shown in FIGS. 2(a)-2(j)

FIG. 3 is a schematic view for explaining the process for preparing the lens-like portions of the dye receiving layer as shown in FIGS. 2(b), 2(e), and 2(h). A dye receiving portion 31 is formed by controlling the exposure conditions of a dye receiving photoresist layer 32. In particular, when light is radiated on when the photoresist layer 32 through the opening of mask 33 with an optimal exposure time and/or an optimal amount of light, the light beams are diffracted from the opening edge of the mask 33 to a portion of the photoresist layer 32 which lies beneath the masking portion of the mask 33. Thus, the surface of the residual dye receiving portion 31 is curved (e.g. in a convex lens shape) when the nonexposed portion of the photoresist layer 32 is removed. A thickness of the dye receiving portion 31 falls within the range of 0.8 $\mu$m to 2 $\mu$m.

According to the present invention, since the color filter array 18 has a focusing effect, light incident through the image pickup lens can be effectively used. Unlike the conventional case wherein only 25 to 30% of incident light is utilized, substantially 100% of incident light can be effectively utilized using this structure. As a result, an electronic camera using the solid-state color imaging device of the present invention has better sensitivity than the prior art devices. An object can be properly photographed without any specific illumination, even in a regular illumination room. In addition, along with the improvement in imaging sensitivity, a S/N ratio is also improved. After the optical signal is photoelectrically transduced, the transduced signal is subjected to the following operation by means of a color separator:

$$W-C=R$$

$$W-Y=B$$

$$W-(R+B)=G$$

where
R: red signal component
G: green signal component
B: blue signal component As a result, correct color separation is performed, thereby obtaining a high-quality image with good hue.

According to the present invention, each full-color light-transmitting filter portion W has a convex lens shape. The convex lens shape of the filter portion W is very important.

Figure 5A:
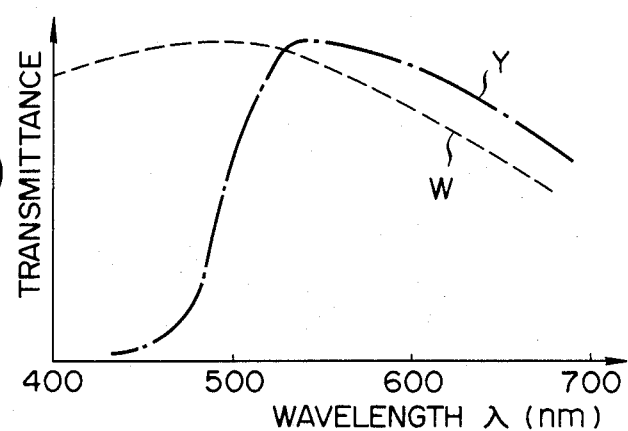
FIGS. 5(a)-5(c) are graphs for explaining the spectral characteristics of the solid-state imaging device of the present invention.
Figure 5B:
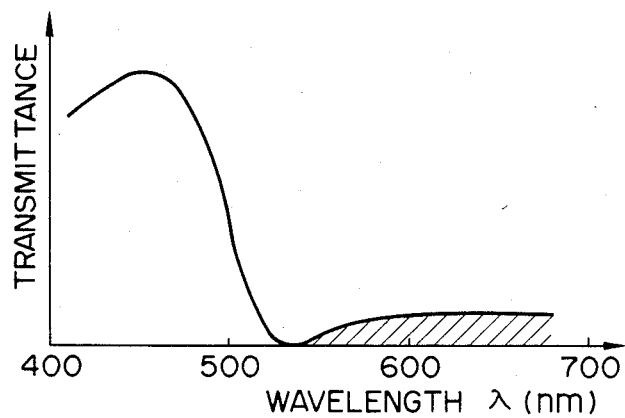

Assume that the lens effect does not occur in the filter portions W, but does occur in other filter portions C and Y. In this case, the transmittance (i.e., spectral response) as a function of the wavelength of the incident light corresponds to what is illustrated in FIG. 5(a). The transmittance of each filter portion Y becomes greater than that of each filter portion W when light having a long wavelength is incident thereon. This implies that an unnecessary wavelength component of the unnecessary wavelength area is included in the blue signal component B, as indicated by the hatched lines in FIG. 5(b), after the photoelectrically transduced signal is subjected to the operation $B=W-Y$. In this manner, when a wavelength component of about 500 nm or longer is detected as that of a blue signal, accurate color signal separation cannot be performed. This can also be applied to the red signal obtained by the calculation $R=W-C$.

Figure 5C:
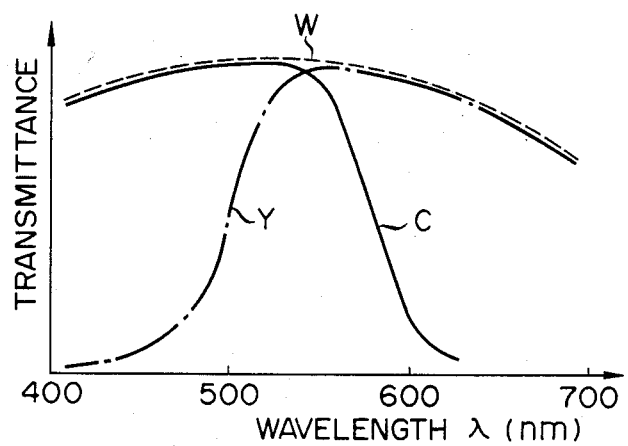

According to the present invention, the transmittance of the filter portion W is increased, as shown in FIG. 5(c), such that the transmittance of a short wavelength becomes equal to that of the filter portion C, and the transmittance of a long wavelength becomes equal to that of the filter portion Y. Therefore, color signal separation can be properly performed by using signals generated from the solid-state imaging device according to the present invention.

When outputs from the respective picture elements of the solid-state imaging device of the present invention are compared using a synchroscope, variations are below 10%. In the device having the filter portion W of a convex lens shape, a flicker ratio is 5%. However, in a device which does not have the filter portion W, a red flicker ratio is 25%. According to this result, it is found that the solid-state imaging device of the present invention provides a high-quality image with good color reproduction and little flicker.

In the above embodiment, an interval between the filter portions W and C is about 1.0$\mu$ to 1.3$\mu$. The convex lens-like filter portion must be formed at least above the corresponding diode 12 so as to achieve the prescribed purpose.

Figure 6:
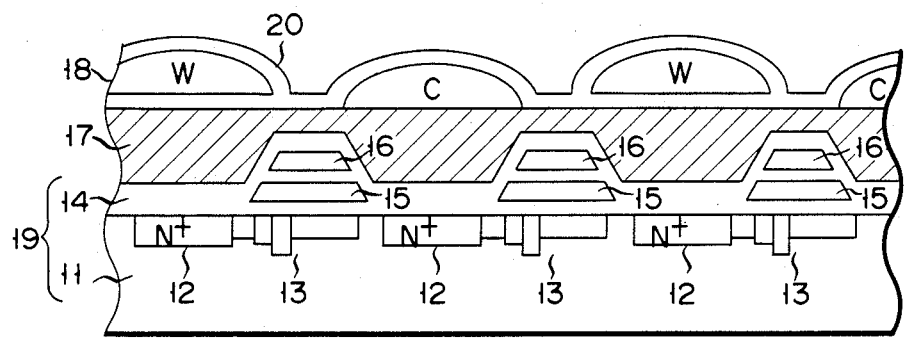
FIGS. 6 and 7 are sectional views of solid-state color imaging devices according to other embodiments of the present invention.
Figure 7:
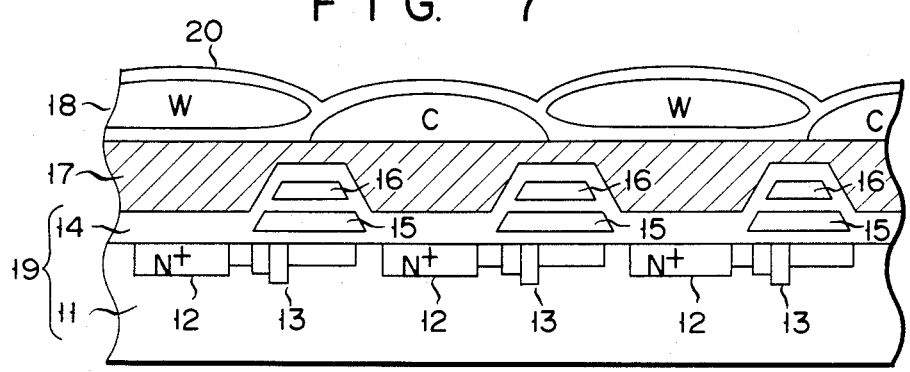

FIGS. 6 and 7 show other embodiments of the present invention. In the embodiment shown in FIG. 6, an interval between convex lens-like filter portions W and C is wider than that shown in FIG. 1. In the embodiment shown in FIG. 7, edge portions of convex lens-like filter portions W and C partially overlap. FIGS. 6 and 7 illustrate only filter portions W and C. However, filter portions Y are also formed in the same manner as are the filter portions W and C. In addition, FIGS. 6 and 7 illustrate the case wherein the lens effect occurs in the horizontal direction. However, the lens effect is omnidirectional.

The present invention is not limited to the color filter array 18 shown in FIG. 4, but may be extended to other color filter arrays such as a Bayer geometry array and an interline geometry array.

Figure 8:
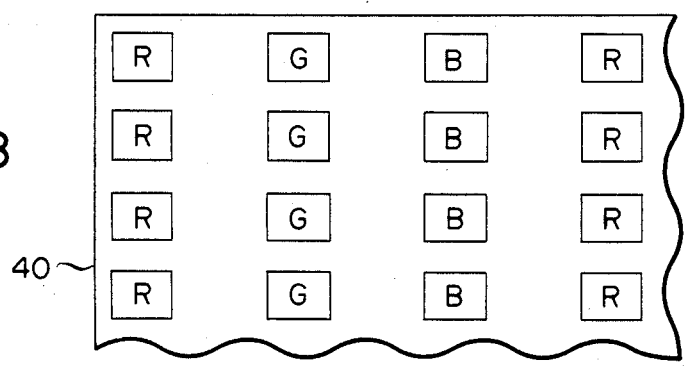
FIG. 8 is a schematic representation showing a color filter array according to still another embodiment of the present invention.

FIG. 8 shows still another color filter array which may be used to the present invention. A color filter array 40 comprises red filter portions R, green filter portions G, and blue filter portions B. The red, green, and blue filter portions are vertically arrayed in columns.

FIG. 9 is a sectional view of a solid-state imaging device having the color filter array 40. A solid-state image sensor 19 and a base layer 17 are formed in the same manner as in the previous embodiments. Reference numeral 41 denotes an overcoat layer. In this embodiment, the intermediate layers 21 and 22 shown in FIGS. 2(d)-2(j) are eliminated. In fact, this embodiment provides a color filter array without intermediate layers.

FIG. 10 shows the process for preparing the color filter array 40 without intermediate layers. A first dyed layer is formed on portions of the base layer 17 which correspond to certain predetermined photodiodes 12. A transparent resist prepared by adding 10% by weight of ammonium dichromate to casein) is used to form the dye receiving layer. The first dye receiving layer is illuminated with ultraviolet light and is exposed in the same manner as in FIG. 3 to obtain a first dye receiving portion layer comprising dye receiving portions having a convex lens-like structure. The resultant solid-state image sensor having the first dye receiving portion layer is dipped in a red dye solution (pH 5, 60° C.) so as to obtain red filter portions R. FIG. 10(a) shows a state wherein the filter portions R are formed.

In order to prevent the red color from blurring from the filter portions R, the dye is fixed. This fixing process is performed by dipping the resultant color filter first in an aqueous solution of 1% by weight of tannic acid and then in an aqueous solution of arsenic oxide.

A second dye receiving layer is formed on portions of the base layer 17 which correspond to other predetermined photodiodes 12 in the same manner as in the case of the first dye receiving layer. The resultant solid-state image sensor structure has the second dye receiving portion layer which is dipped in a green dye solution (pH 5, 60° C.) so as to obtain green filter portions G. FIG. 10(b) shows a state wherein the filter portions G are formed.

In order to prevent the green color to blurring from the filter portions G, the dye fixing process is performed in the same manner as described above. A third dye receiving portion layer is then formed in the same manner as the first and second dye receiving portion layers. The resultant structure having the third dye receiving portion layer is dipped in a blue dye solution, and the blue dye is then fixed. FIG. 10(c) shows a state wherein blue filter portions B are formed. In this manner, after the filter portions R, G, and B are formed, an overcoat layer 41 of a transparent acrylic-based resist is formed on the upper surface of the entire color filter array 40, as shown in FIG. 10(d).

The fabrication process described with reference to FIGS. 10(a)-10(d) can also be applied to the process for fabricating the solid-state color imaging device having the color filter array shown in FIG. 4. The process for fabricating the solid-state color imaging device described with reference to FIGS. 2(a)-2(j) can also be applied to the solid-state imaging device having the color filter array shown in FIG. 8. Furthermore, the solid-state image sensor 19 comprises a CCD type solid-state image sensor in each of the previous embodiments. However, the present invention is not limited to a solid-state image sensor of this type, but may be extended to include a MOS type or CID type solid-state image sensors.

What is claimed is:

1. A solid-state color imaging device comprising:
   a solid-state image sensor formed with a plurality of picture elements arrayed on one surface thereof in a two-dimensional array; and
   a color filter array integrally formed on said solid-state image sensor to have focusing color filter portions in one-to-one correspondence with said picture elements, said focusing color filter portions acting as lenses to focus incident light onto said picture elements and including cyan focusing color filter portions C, yellow focusing color filter portions Y and full-color light-transmitting focusing color filter portions W.

2. A device according to claim 1, wherein the edges of adjacent focusing color filter portions of said color filter array overlap each other.

3. A device according to claim 2, wherein an intermediate layer of a transparent resist is formed at least between said overlapping edges of said adjacent focusing color filter portions so as to prevent said adjacent focusing color filter portions from blurring.

4. A solid-state color imaging device comprising:
   a solid-state image sensor formed with a plurality of picture elements arrayed on one surface thereof in a two-dimensional array;
   a base layer formed on said one surface of said solid-state image sensor; and
   a color filter array integrally formed on said base layer to have focusing color filter portions in one-to-one correspondence with said picture elements, said focusing color filter portions acting as lenses to focus incident light onto said picture elements, wherein said color filter array comprises:
   (a) cyan focusing color filter portions C formed on said base layer;
   (b) a first intermediate layer formed on said cyan focusing color filter portions C and on that portion of said base layer on which said cyan focusing color filter portions C do not lie;
   (c) yellow focusing color filter portions Y formed on portions of said first intermediate layer under which said cyan focusing color filter portions C do not lie;
   (d) a second intermediate layer formed on said yellow focusing color filter portions Y and on that portion of said first intermediate layer on which said yellow focusing color filter portions Y do not lie;
   (e) full-color light-transmitting focusing color filter portions W formed on portions of said second intermediate layer under which said cyan focusing color filter portions C and said yellow focusing color filter portions Y do not lie; and
   (f) an overcoat layer formed on said full-color light-transmitting focusing color filter portions W and on that portion of said second intermediate layer on which said full-color light-transmitting focusing color filter portions W do not lie.

5. A device according to claim 4, wherein each of said focusing color filter portions is formed in a convex lens-like shape.

6. A process for fabricating a solid-state color imaging device comprising:
- a first step for forming a base layer on a solid-state image sensor having a plurality of picture elements arrayed in a two-dimensional array so as to provide an even surface on said solid-state image sensor;
- a second step for forming a first convex lens-like dye receiving portion layer of a transparent resist on even surface portions of said base layer which correspond to first predetermined picture elements of said plurality of picture elements;
- a third step for dipping the resultant solid-state image sensor structure having said first dye receiving portion layer in a cyan dye solution so as to dye said first dye receiving portion layer cyan to form cyan focusing color filter portions;
- a fourth step for forming a first intermediate layer on said cyan focusing color filter portions obtained by the third step and on the remaining portion of said base layer surface so as to prevent said cyan focusing color filter portions from blurring;
- a fifth step for forming a second convex lens-like dye receiving portion layer of a transparent resist on portions of said first intermediate layer obtained by the fourth step which correspond to second predetermined picture elements of said plurality of picture elements;
- a sixth step for dipping the resultant solid-state image sensor structure having said second dye receiving portion layer in a yellow dye solution so as to dye said second dye receiving portion layer yellow to form yellow focusing color filter portions;
- a seventh step for forming a second intermediate layer on said yellow focusing color filter portions obtained by the sixth step and on the remaining portion of said first intermediate layer so as to prevent said yellow focusing color filter portions from blurring;
- an eighth step for forming a third convex lens-like dye receiving portion layer of a transparent resist on portions of said second intermediate layer obtained by the seventh step which correspond to third predetermined picture elements of said plurality of picture elements so as to form full-color light-transmitting focusing color filter portions; and
- a ninth step for forming an overcoat layer on said full-color light-transmitting focusing color filter portions obtained by the eighth step and on the remaining portion of said second intermediate layer.

7. A process for fabricating a solid-state color imaging device comprising:
- a first step for forming a base layer on a solid-state image sensor having a plurality of picture elements arrayed in a two-dimensional array so as to provide an even surface on said solid-state image sensor;
- a second step for forming a first convex lens-like dye receiving portion layer of a transparent resist on even surface portions of said base layer which correspond to first predetermined picture elements of said plurality of picture elements;
- a third step for dipping the resultant solid-state image sensor structure having said first dye receiving portion layer in a first dye solution so as to dye said first dye receiving portion layer a first color to form first focusing color filter portions;
- a fourth step for dipping the resultant solid-state image sensor structure first in an aqueous solution of tannic acid and subsequently in an aqueous solution of arsenic oxide so as to fix the dye of said first focusing color filter portions obtained by the third step and prevent said first focusing color filter portions from blurring;
- a fifth step for forming a second convex lens-like dye receiving portion layer of a transparent resist on even surface portions of said base layer of the resultant solid-state image sensor structure obtained by the fourth step which correspond to second predetermined picture elements of said plurality of picture elements;
- a sixth step for dipping the resultant solid-state image sensor structure having said second dye receiving portion layer in a second dye solution so as to dye said second dye receiving portion layer a second color to form second focusing color filter portions;
- a seventh step for dipping the resultant solid-state image sensor structure first in an aqueous solution of tannic acid and subsequently in an aqueous solution of arsenic oxide so as to fix the dye of said second focusing color filter portions obtained by the sixth step and prevent said second focusing color filter portions from blurring;
- an eighth step for forming a third convex lens-like dye receiving portion layer of a transparent resist on even surface portions of said base layer of the resultant solid-state image sensor structure obtained by the seventh step which correspond to third predetermined picture elements of said plurality of picture elements so as to form third focusing color filter portions; and
- a ninth step for forming an overcoat layer on said first, said second and said third focusing color filter portions and on any remaining portion of said base layer.

* * * * *